(12) United States Patent
Miquel et al.

(10) Patent No.: US 6,356,747 B1
(45) Date of Patent: Mar. 12, 2002

(54) INTERMEDIARY LOW-FREQUENCY FREQUENCY-CONVERSION RADIOFREQUENCY RECEPTION

(75) Inventors: Régis Miquel, Grenoble; Patrice Garcia, Saint Martin d'Heres, both of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/362,321

(22) Filed: Jul. 27, 1999

(30) Foreign Application Priority Data

Jul. 28, 1998 (FR) .............................. 98 09800

(51) Int. Cl.[7] .............................................. H04B 1/26
(52) U.S. Cl. ....................................... 455/324; 455/304
(58) Field of Search .................................. 455/296, 303, 455/304, 305, 306, 324, 338, 340; 375/344, 345, 329, 334

(56) References Cited

U.S. PATENT DOCUMENTS

| 5,249,203 A | 9/1993 | Loper ........................... 375/97 |
| 5,697,093 A | * 12/1997 | Cusdin et al. ............... 455/324 |
| 5,828,955 A | 10/1998 | Satyamurti et al. .......... 704/211 |
| 6,115,593 A | * 9/2000 | Alinikula et al. ............ 455/324 |

* cited by examiner

Primary Examiner—Thanh Cong Le
(74) Attorney, Agent, or Firm—Wolf, Greenfield & Sacks, P.C.; James H. Morris

(57) ABSTRACT

The present invention relates to a frequency conversion receiver at low intermediary frequency including a first analog mixer of a received signal with a signal coming from a local oscillator at a first conversion frequency and a second analog mixer of the incoming signal with the signal coming from the local oscillator out of phase by 90°. The receiver further includes, on the digital side, circuitry for detecting a possible phase difference and a possible gain difference between the signals of the two paths, the first conversion frequency corresponding to the central frequency of the received channel, plus half the channel frequency band.

8 Claims, 3 Drawing Sheets

INTERMEDIARY LOW-FREQUENCY FREQUENCY-CONVERSION RADIOFREQUENCY RECEPTION

BACKGROUND OF THE INVENTION

1. Field of the Invention

The present invention relates to the field of radiofrequency transmission and, more specifically, to the reception of a communication channel in a multiple-channel transmission system.

A specific example of application of the present invention is the field of radiotelephony which uses several communication channels in an allotted frequency band. For example, a so-called GSM (Global System Mobile) protocol uses a 25-MHz band centered on the 947.5 MHz frequency. Another example is the DCS (Digital Cellular System) protocol which uses a 25-MHz band centered on the 1.895-GHz frequency. In these two radiotelephony protocols, the 25-MHz band is divided into channels of 200 kHz assigned to the different communications. In such a system, each mobile phone, that is, each transmitter-receiver, is capable of using any of the transmission channels to complete a call.

The present invention more specifically relates to the reception of information which, in such systems or the like, has to be performed by extracting from the entire frequency band only those frequencies of the considered channel which are desired to be received, hereafter called the useful channel.

2. Discussion of the Related Art

The useful channel recovery, on the receive side, uses filtering techniques for suppressing any frequency located outside the frequency band of the useful channel.

Among receivers known to perform this function, one of the most current ones is the so-called heterodyne receiver. Such a receiver includes, on the path of the signal from a reception antenna, a first surface wave filter for rejecting any frequency outside the so-called useful reception band (Rx) assigned to the communication system (for example, all frequencies outside the ±12.5 MHz range around the 947.5 MHz frequency for the GSM), followed by a low noise amplifier for amplifying the signal, then by a mixer for performing a first frequency conversion, that is, a frequency shift to an intermediary frequency on the order of 100 MHz. The frequency of the local oscillator of the mixer is set so that an intermediary 100-MHz frequency corresponds to the central frequency of the useful channel. The use of such a mixer requires an image filter for removing a parasitic frequency band, or image band, due to the frequency shift. The image filter is placed upstream of the mixer and is used to push back the image band which is otherwise superposed to the useful band (here, the band centered on the intermediary frequency). Downstream of the mixer, a third, so-called intermediary band-pass filter is used, centered on the intermediary frequency to reduce useful band Rx. This band-pass filter has, for example, a bandwidth on the order of a few MHz centered on a central 100-MHz frequency. The signal then obtained is the signal resulting from a first frequency conversion which has to undergo a second frequency conversion to shift the intermediary frequency towards a zero frequency, to only recover the original baseband modulation.

The modulations most often used in transmission systems, in particular in radiotelephony systems, require a phase information. The second frequency conversion thus has to be performed in phase and in phase quadrature, to obtain a compound signal. This second frequency conversion is, in a heterodyne receiver, performed by two mixers of the signal resulting from the first frequency conversion with a frequency equal to the first intermediary frequency, that is, 100 MHz in the above a example. The 100-MHz frequency provided to the two mixers comes from a local oscillator and the mixers receive this local oscillation frequency respectively in phase and out of phase by 90° to obtain, at the output of the second conversion, signals in phase and in phase quadrature. At the output of the second conversion, the baseband useful channel and a parasitic band centered on 200 MHz, which is easily suppressed with a low-pass filter, are obtained.

The signals resulting from the second frequency conversion are most often converted into digital signals by analog-to-digital converters, generally so-called delta-sigma converters, after which they are digitally demodulated.

More recently, a so-called direct conversion technique has been provided for radiofrequency transmission receivers.

FIG. 1 very schematically shows a conventional example of a direct conversion system of a radiofrequency signal converter.

As for a heterodyne receiver, the signals received from an antenna 1 are routed through a surface wave filter 2 having the function of rejecting the frequencies out of the reception band Rx of the considered system. Referring to the GSM example, this filter rejects the frequencies outside the useful band included between 935 MHz and 960 MHz. Filter 2 is followed, as previously, by a low noise amplifier (LNA) 3. The output of amplifier 3 is, in the direct conversion system illustrated by FIG. 1, sent to two mixers 4, 5, the respective inputs of which receive a frequency corresponding to the central frequency of the considered reception channel. This frequency is provided by a local oscillator 6 (LO) and mixers 4 and 5 respectively receive the central frequency of the channel in phase and out of phase by 90°so that their respective outputs are in phase and in phase quadrature. The outputs of mixers 4 and 5 thus directly provide the received signal in baseband since the frequency of local oscillator 6 is chosen for the intermediary frequency of the direct conversion to be null. The parasitic band is very far (centered on twice the frequency of local oscillator 6) from the useful band and can thus easily be suppressed by filtering. Each mixer 4, 5 is followed by a low-pass filter (LPF), respectively 7, 8, for suppressing the channels neighboring the channel which is desired to be received and the image band. Each filter 7, 8 is associated at its output with an automatic gain control amplifier (AGC), respectively 9, 10, the respective outputs of which form the outputs of the so-called null intermediary frequency direct conversion system.

Then, for example, analog-to-digital converters (CAN) 11, 12 followed by a digital demodulation circuit 13 are provided.

An advantage of a null intermediary frequency direct conversion system such as illustrated in FIG. 1 is that it is more easily integrable than a heterodyne receiver, since the two filters (image and intermediary filters) of a heterodyne receiver are not necessary therein. Currently, these filters are not integrable. A direct conversion receiver is thus generally less expensive than a heterodyne receiver. Further, its power consumption is lower and it generates less power dissipation.

However, a direct conversion receiver has the disadvantage that the useful channel is corrupted by noise coming, in particular, from the D.C. offset resulting from the superposition of the useful signal to the D.C. system supply signal. The D.C. offset is variable and thus has a frequency spectrum of low frequencies.

It should be noted that the D.C. offset of course exists in the case of a heterodyne receiver. However, since the useful channel is centered on a 100-MHz frequency, it does not superpose to this D.C. offset which is suppressed by the intermediary filter.

Another disadvantage of a null intermediary frequency direct conversion system is the low frequency noise, called the 1/f noise, which superposes on the converted signal.

A third known solution (not shown) for receiving a radiofrequency signal is to directly perform an analog-to-digital conversion of the received signal and to transfer the filtering to the digital side. Although such a solution can be implemented for relatively low frequencies (under one MHz), it can be difficult to apply to higher frequencies and, in particular, to radiotelephony systems having frequencies on the order of one GHz or above, due to the required sampling frequencies which are then too high for existing digital systems.

The International Patent Application 9708842 discloses a method for receiving radio frequency signals through an iterative process for extracting possible phase errors and gain errors. A drawback of this method is that the error detection must be permanently active, even during the reception of useful data. Another drawback is that this method is efficient only within a very narrow frequency band around the central frequency of the channel and is therefore not applicable to broad band systems.

European Patent Application 0501740 also discloses a system using an iterative method.

SUMMARY OF THE INVENTION

The present invention aims at providing a novel frequency conversion architecture which overcomes the disadvantages of conventional solutions. In particular, the present invention aims at overcoming the problem of the D.C. offset and of low frequency noise.

The present invention also aims at providing a solution which improves or optimizes the possibility of system integration and which, especially, maintains the advantages of a direct conversion system with respect to a heterodyne system.

The present invention also aims at providing a novel radiofrequency signal reception architecture using digital filtering. In particular, the present invention aims at providing a novel solution which, on the digital side, is particularly adapted to the frequency conversion at low intermediary frequency.

To achieve these and other objects, the present invention provides a frequency conversion receiver at low intermediary frequency including:

a first analog mixer of a received signal with a signal coming from a local oscillator at a first conversion frequency, the output of the first mixer defining a first path meant to be subject to an analog-to-digital conversion;

a second analog mixer of the incoming signal with the signal coming from the local oscillator out of phase by 90°, the output of the second mixer defining a second path meant to be subject to an analog-to-digital conversion; and on the digital side, means for detecting a possible phase difference and a possible gain difference between the signals of the two paths, the first conversion frequency corresponding to the central frequency of the received channel, plus half the channel frequency band.

According to an embodiment of the present invention, the receiver includes, on the digital side, a first means for extracting a first measured value corresponding to the amplitude of the first path out of phase by 90° and minus the amplitude of the second path, a second means for extracting a second value corresponding to the amplitude of the first path out of phase by 90° and plus the amplitude of the second path, and means for measuring the respective amplitudes of the two paths.

According to an embodiment of the present invention, the receiver includes, on the digital side, means for applying, to at least one of the paths, a compensation based on the previously calculated values.

The present invention also provides a method of reception of radiofrequency signals of the type including a first analog frequency conversion performed on the received signal and providing two analog paths respectively in phase and in phase quadrature, and a second frequency conversion performed after quantization of signals resulting from the first frequency conversion, the method including, on the digital side, performing a compensation of possible phase and/or gain drifts between the two analog paths.

According to an embodiment of the present invention, the compensation is performed in a non-iterative manner.

According to an embodiment of the present invention, the following are extracted from the two digital paths: the amplitude of each path; a first measurement value corresponding to the amplitude of a first path out of phase by 90° and minus the amplitude of the second path; and a second measurement value corresponding to the amplitude of the first path out of phase by 90° and plus the amplitude of the second path.

According to an embodiment of the present invention, the median frequency of the useful band of the received channel is chosen to be the intermediary frequency of the useful band of the received channel.

According to an embodiment of the present invention, the second frequency conversion is performed at a null intermediary frequency.

The foregoing objects, features and advantages of the present invention, will be discussed in detail in the following non-limiting description of specific embodiments in connection with the accompanying drawings.

DETAILED DESCRIPTION

Figure 1:
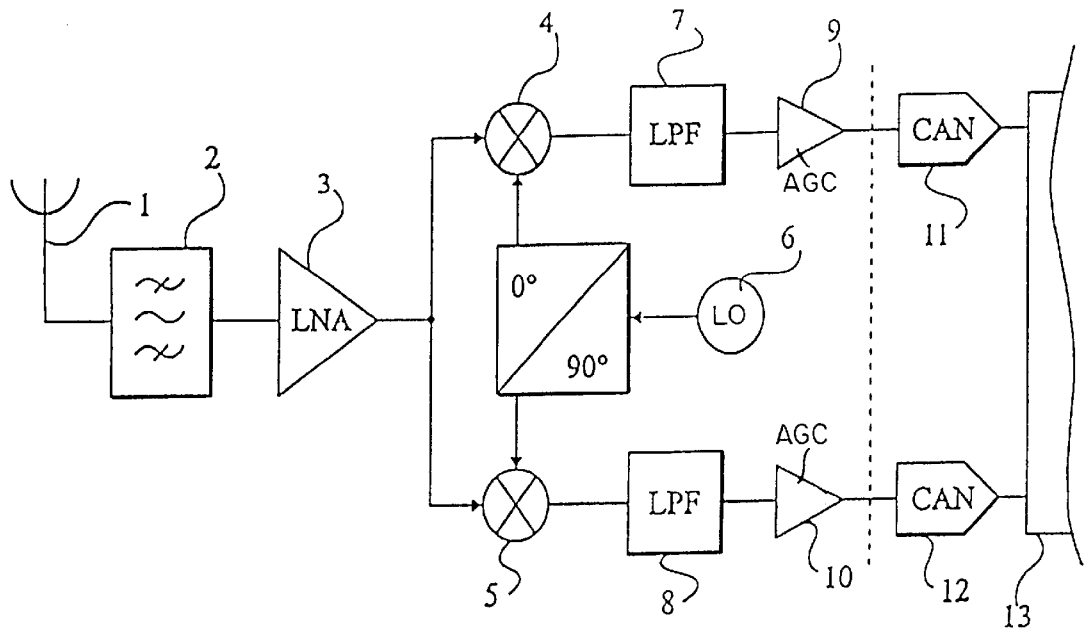
FIG. 1, previously described, is meant to show the state of the art and the problem to solve.

The same elements have been referred to with the same references in the different drawings. For clarity, only those elements of a radiofrequency signal receiver which are necessary to the understanding of the present invention have been shown in the drawings and will be described hereafter.

Figure 2:
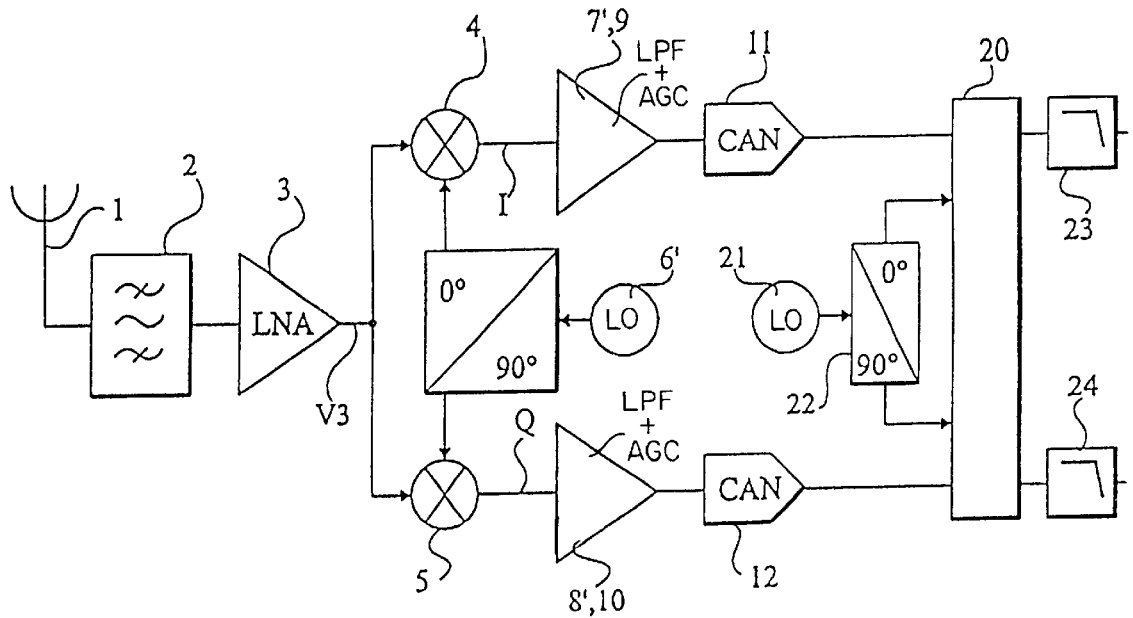
FIG. 2 very schematically shows an embodiment of a frequency conversion receiver according to the present invention.

FIG. 2 very schematically shows an embodiment of a radiofrequency receiver architecture according to the present invention. It is, for example, a radiotelephony GSM receiver.

As in a conventional receiver, the receiver of FIG. 2 includes, from an antenna 1, a surface wave filter 2 followed by a low noise amplifier 3 (LNA). Filter 2 is meant to reject the frequencies located outside the useful band containing the channels of the communication protocol involved.

Figure 3A:
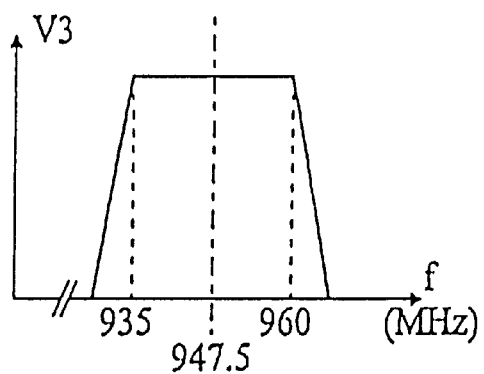
FIGS. 3A and 3B illustrate the operation of the receiver of FIG. 2.

FIG. 3A illustrates the frequency characteristic of signal V3 at the output of amplifier 3. In the example shown where protocol GSM is considered, band-pass filter 2 is centered on the 974.5-MHz frequency and has a 25-MHz bandwidth to let through all channels of the GSM protocol.

Signal V3 is, as in a null intermediary frequency direct conversion system such as illustrated in FIG. 1, sent onto two mixers 4, 5 intended for shifting the frequency signal and providing one signal in phase and one signal in phase quadrature. Each mixer 4, 5 thus receives, on a second input, a reference frequency provided by a local oscillator 6' (OL), respectively in phase for mixer 4 and in phase quadrature for mixer 5.

The frequency of local oscillator 6' is chosen to obtain a non-zero intermediary low frequency. This intermediary frequency is, according to a first feature of the present invention, chosen to correspond to the central frequency of the useful channel. Thus, in the GSM example, where the channels have a width of 200 kHz each, the frequency of local oscillator 6' is chosen to obtain a 100-kHz intermediary frequency.

The choice of the intermediary low frequency as being the median frequency of the useful channel is important to make the rejection of the image frequency compatible with digital techniques and to facilitate its filtering. Indeed, since the intermediary frequency is not null, there exists an image channel for each channel. The closer the image band is to the useful band, the smaller the image rejection factor, that is, the attenuation of the image band forming an interference signal, which facilitates its attenuation by a digital processor. However, the image band does not superpose, even partially, to the useful band.

Thus, if a receive channel is a channel having for example a 950-MHz central frequency, a 849.9-MHz frequency will be chosen for local oscillator 6', which results, after mixing, in a 100-kHz intermediary frequency on the two paths resulting from the mixing. The two paths are, conventionally, designated as I and Q and respectively correspond to the real and imaginary parts of the signal.

Figure 3B:
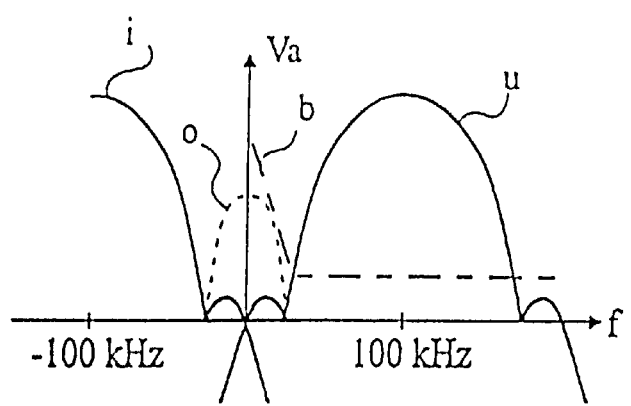

FIG. 3B illustrates the output frequency characteristic (spectrum) of mixers 4 and 5. The useful channel spectrum u has been shown in full line and is thus centered on the intermediary 100-kHz frequency. The image channel spectrum i is centered on the—100-kHz frequency and is also shown in full line. It should already be noted that the respective spectrums of the image channel and of the useful channel are separate.

The spectrum o of the D.C. offset has been shown in dotted lines. It is an estimation of the frequency range of the D.C. offset which can be considered as representing a frequency band under 20 kHz. Spectrum o thus is centered on the zero frequency.

According to the present invention, advantage is taken from the fact that, in a useful channel of a 200-kHz bandwidth, the spectral distribution is gaussian and the spectrum ends can in practice be neglected. As a result, the useful signal is, as illustrated in FIG. 3B, essentially contained within the ¾ of the channel around the central frequency. Accordingly, conversely to the case where the intermediary frequency is chosen to be null (FIG. 1), useful channel u does not superpose to the band of the D.C. offset.

The D.C. offset can thus be filtered with no significant consequence for the useful channel.

The fact of the gaussian distribution of the information in the useful channel is also used to reduce or minimize the effect of the low frequency noise and of the thermal noise. Indeed, as illustrated in FIG. 3B by stripe-dot line h, most of the useful signal of channel u superposes to a white noise (homogeneous spectral distribution, horizontal portion of characteristic b in FIG. 3B), most of the low frequency noise being, as for the D.C. offset, outside the significant portion of the information of useful channel u.

The choice of the intermediary frequency as being the half-length of the baseband useful channel enables, as will be seen hereafter, transferring the filtering to retrieve the baseband signal on the digital side while simplifying this digital processing. Indeed, the parasites due to the D.C. offset and to the 1/f noise may be suppressed by filtering over their frequency band, which is much simpler than a variable algorithm used in the case of a null intermediary frequency direct conversion.

The respective outputs of mixers 4 and 5 are sent onto conventional low-pass filters followed by automatic gain control amplifiers. For simplification, the low-pass filters (LPF) and the automatic gain control amplifiers (AGC) have been shown together in FIG. 2 in the form of blocks 7', 9 and 8', 10. The cut-off frequency of the low-pass filters is, ideally, chosen around 200 kHz to suppress all channels above the useful channel. In practice, due to the imperfection of the filters, this cut-off frequency will be on the order of 500 kHz. The final filtering is performed on the digital side.

Paths I and Q are then converted into digital signals by conventional converters 11, 12, for example, delta-sigma converters (CAN). On the digital side, a second frequency conversion is performed by conventionally using a signal processing circuit 20 including a compound mixer associated with a local oscillator 21 (LO) and with a phase shifter 22 for providing the local oscillator frequency respectively in phase and in phase quadrature to the compound mixer.

According to the present invention, the frequency of local oscillator 21 is equal to the intermediary frequency of the first conversion, that is, 100 kHz herein, so that after the mixing, the reception channel is in baseband. Thus, all the digital processing is performed in baseband.

Thus, only the analog-to-digital conversion is performed in intermediary frequency (which enables decoupling the D.C. offset of the useful signal). This amounts to quantizing the signal with a given frequency offset, and bringing it back digitally in baseband to subsequently extract it by low-pass filtering. This filtering is illustrated in FIG. 2 by two blocks 23, 24, respectively on paths I and Q, at the output of circuit 20.

It should be noted that, after the first analog frequency conversion (mixers 4 and 5), the image channel i of useful channel u is superposed to the channel (−1) of immediately lower rank. In the absence of the second digital conversion, this preceding channel would alias on the 100-kHz frequency and corrupt the useful channel without it being possible to filter it. The digital frequency conversion performed by circuit 20 enables having this preceding channel as well as image channel i centered on a −100-kHz frequency end up, after mixing with the frequency of local oscillator 21 at 100 kHz, centered on a −200-kHz frequency. Thus, it is possible to filter by means of low-pass filters 23, 24, the cut-off frequencies of which are on the order of from −100 kHz to 100 kHz, to only keep the useful signal in baseband.

More generally and without taking account of the second frequency conversion, it can be said that, for a 100-kHz intermediary frequency, upon the first analog frequency conversion, the adjacent channels of order +/−1 with respect to the useful channel are respectively centered on −100 and 300 kHz, and those of order +/−2 with respect to the useful channel on −300 and 500 kHz. Channel −1 will generate a parasitic (image) spectrum on +100 kHz, that is, right on the useful channel.

Similarly, channel −2 on −300 kHz will generate a parasitic spectrum on +300 kHz close to the useful channel.

These two parasitic spectrums will be, after the second frequency conversion, moved away from the useful channel and will thus be able to be filtered by the low-pass filtering. Indeed, channel −1 is centered on the −200-kHz frequency and channel −2 is centered on the −400-kHz frequency at the output of circuit 20. Accordingly, even if these spectrums alias (respectively, on +200 kHz and +400 kHz), they can be filtered by filters 23 and 24 which have a bandwidth from −100 kHz to 100 kHz. Similarly, the useful channel centered on the 100-kHz frequency will generate a parasitic spectrum at −100 kHz which is not directly disturbing for the useful channel since it will be at −200 kHz after the second conversion.

Thus, by choosing a first frequency conversion with an intermediary frequency centered on the median frequency of the useful channel, the problems due to the D.C. offset and to the low frequency noise can be suppressed by implementing the present invention, while providing a circuit, most elements of which are integrable.

The radiofrequency reception architecture described hereabove is, according to a feature of the present invention, optimized to overcome possible technological dispersions of the components and, in particular, an imbalance between paths I and Q after the first frequency conversion.

Indeed, mixers 4, 5 and filters 7', 8' (FIG. 2) are likely to have slightly different characteristics from one path to another. Such characteristic differences can introduce phase and gain errors between paths I and Q. These phase and gain errors result, on the frequency spectrums, in a complete overlapping (aliasing) of the image channel (i, FIG. 3B) with useful channel 4, as well as with the channel (−1) preceding the useful channel. Such an aliasing of the useful channel and of the image channel is not suppressed by the filtering and the frequency conversion on the digital side.

Thus, according to the present invention, it is desired to make the maximum phase and gain error compatible with the carrier/image ratio and with the intermediary frequency which determine the image channel and the desired image rejection.

A first solution could include adapting the coupling of the low-pass filters of paths I and Q to minimize the errors. Indeed, phase and gain differences exist due to a misalignment of the attenuation contours of the filters or of the automatic gain control amplifiers, due to manufacturing tolerances. This solution is particularly difficult to implement in practice.

Thus, the present invention performs, on the digital side, a correction of the phase and gain variations between paths I and Q, due to the analog portion.

A problem which arises in case of an imbalance between paths I and Q is to know by what value to compensate each of the paths and from which error amplitude.

A first embodiment, not shown, of the present invention includes varying the local oscillator frequency (21, FIG. 2), on the digital side, to compensate a phase and gain variation between paths I and Q.

Calling $\Delta G$ the gain error between paths I and Q, $\Delta \Phi$ the phase error between paths I and Q, $\omega$ the pulse, and t the current time, signal $S(\omega t)$ which, when perfect can be written as $I(\omega t)+jQ(\omega t)$, becomes:

$$S'(\omega t)=I(\omega t)+j\alpha Q(\omega t+\Delta \Phi),$$

where $\alpha$ designates the amplitude error of path Q with respect to path I.

According to the first embodiment of the present invention, path Q of the second local oscillator, that is, the path out of phase by 90°, is multiplied by the inverse of the gain difference, and the result of the phase error multiplied by the squared gain error is shifted in phase. This amounts, on the digital side, to multiplying signal $S'(\omega t)$ by a signal in the form of:

$$\cos(\omega 2 t)+j\,\sin(\omega 2 t+\Delta \Phi \alpha^2)/\alpha,$$

where $\omega 2$ designates the pulse of the second local oscillator.

With such a correction, a perfect correction is obtained, neglecting terms of second order.

Thus, if the phase error and the gain error between paths I and Q can be known, a correction on the digital side which compensates these errors can be performed.

Figure 4:
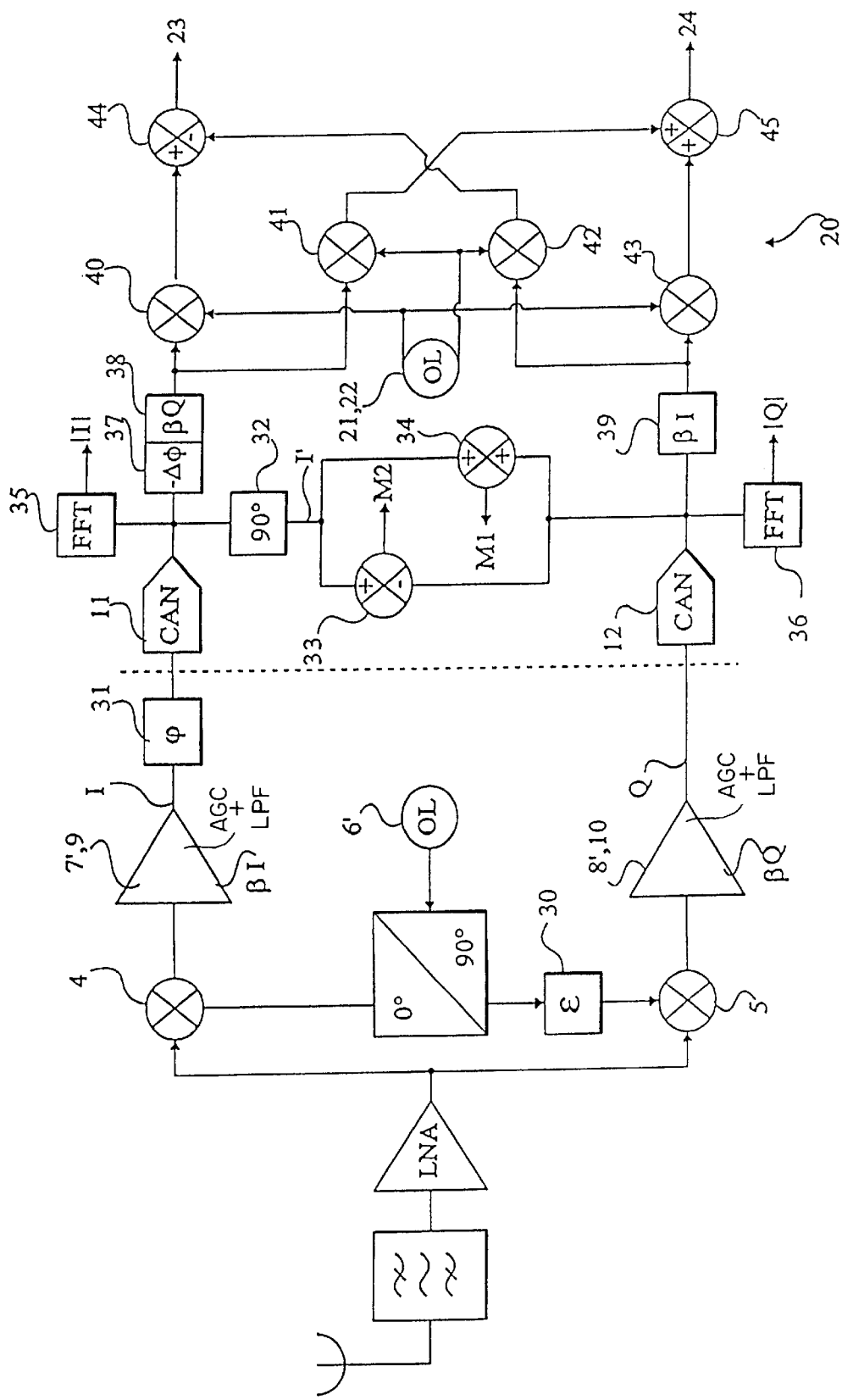
FIG. 4 shows a preferred embodiment of a receiver according to the present invention.

FIG. 4 shows a second preferred embodiment of the present invention. This drawing illustrates, in a very simplified manner, the architecture of a receiver according to this preferred embodiment. The analog portion of the receiver is similar to that illustrated in relation with FIG. 2. The only difference is that the phase errors, respectively $\phi$ between paths I and Q and e between the two paths of local oscillator 6', have been modeled by blocks, respectively 30 and 31. The gain difference $\Delta G$ between paths I and Q has not been modeled in FIG. 4 by additional blocks, but reference will be made hereafter to respective gains $\beta I$ and $\beta Q$ of paths I and Q, linked with the gains of the low-pass filters and of the automatic gain control amplifiers.

Starting from the previously discussed solution, it is desired to determine the phase and gain variations linked with the analog portion according to the frequency to determine, on the digital side, the correction transfer function to be applied to paths I and Q to compensate these errors. It is however difficult to separately determine these two values ($\Delta \Phi = \epsilon - \phi$ and $\Delta G$). One of the two values indeed has to be known to determine the other.

Known solutions to solve similar determinations use iteration methods, the number of iterations of which determines the accuracy of the determination. For example, the image band may be iteratively suppressed by a correction adjustment on the digital side. The obvious drawback of such an iterative process is that it requires a lot of calculation and remains an approximation.

A feature of the present invention is to provide a novel solution for correcting, on the digital side, possible drifts between paths I and Q due to the analog portion. A feature of this solution is to be non-iterative.

According to this embodiment of the present invention, it is provided to extract, from digital paths I and Q, two specific measurement values enabling determination of the phase and gain differences. A first value M1 corresponds to path I out of phase by 90° to which path Q is subtracted. A second value M2 corresponds to path I out of phase by 90° to which path Q is added.

Another characteristic of the invention is that measurements are made outside the reception periods during a preliminary phase, prior to the data reception so as to "freeze" possible errors prior to the reception of useful data.

In FIG. 4, the obtaining of these two values M1 and M2 has been illustrated in the form of a block diagram. At the output of analog-to-digital converter 11 of path I, a phase shifter 32 by 90° is arranged, its output being sent onto the first respective inputs of a subtractor 33 and of an adder 34. The second respective inputs of adder 34 and of subtractor 33 respectively receive the output signal of the analog-to-digital converter 12 of path Q with a negative sign for subtractor 33 providing value M2 and with a positive sign for adder 34 providing value M1.

The two other values required to be measured to implement this solution are the respective amplitudes of paths I and Q. To obtain these amplitudes, the output signals of analog-to-digital converters 11 and 12 are sampled, and fast Fourier transforms, respectively modeled by blocks 35 and 36 in FIG. 4, are applied thereto. Blocks 35 and 36 then provide the respective absolute values of signals I and Q.

Based on these four measurements, the phase and gain variations between paths I and Q can be deduced.

Phase variation $\Delta\Phi$ can be written as $\epsilon-\phi$ and, based on the previously indicated measurements, this phase difference can be expressed as follows:

$$\varepsilon - \varphi = \pi - Arcos\left[\frac{|M1|^2 - |M2|^2}{\beta Q\sqrt{2(|M1|^2 + |M2|^2) - \beta Q^2}}\right],$$

where $\beta Q$ can be written as follows:

$$\beta Q = \sqrt{\frac{2(|M1|^2 + |M2|^2)}{1 + \frac{|I|^2}{|Q|^2}}}.$$

The gain difference between paths I and Q can be written as:

$$\Delta G = 20\log\left(\frac{\beta I}{\beta Q}\right),$$

where $\beta I$ corresponds to the analog gain of path I and can be written as:

$$\beta I = \frac{|M1|^2 - |M2|^2}{\beta Q\cos(\varphi - \varepsilon)}.$$

To apply the correction on the digital side of the receiver, it is thus sufficient, according to the present invention, to apply a compensation transfer function to signals I and Q. In a particularly simple way, this transfer function corresponds, with the modeling taken in relation with FIG. 4, to applying to signal I a phase shift by $-\Delta\Phi(\phi-\epsilon)$, symbolized by a block 37, and applying to both paths I and Q the respective gain ($\beta Q$, $\beta I$) of the other path. These gain compensations have been symbolized in FIG. 4 by blocks 38 and 39, respectively on paths I and Q.

Indeed, writing that, for signals I and Q just before the analog-to-digital conversion of converters 11 and 12:

$$I = \frac{\beta I}{4}(e^{-j\omega t}e^{j\varphi} - e^{j\omega t}e^{-j\varphi}), \text{ and}$$

the following relations which, according to the present invention, are chosen to form values M1 and M2 can then be written, for I'=I out of phase by 90°:

$$Q = \frac{\beta Q}{4}(e^{j\omega t}e^{-j\varepsilon} + e^{-j\omega t}e^{j\varepsilon}),$$

$M2=|I'-Q|=\frac{1}{2}\sqrt{\beta I^2+\beta Q^{2-2\beta I\beta Q\cos(\phi-\epsilon)}}$, and $M1=|I'-Q|=\frac{1}{2}\sqrt{\beta I^2+\beta Q^{2+2\beta I\beta Q\cos(\phi-\epsilon)}}$.

Writing:

$K1=M2^2+M1^2=\frac{1}{2}(\beta I^2+\beta Q^2)$, and $K2=M1^2+M2^2=-\beta I\beta Q\cos(\phi-\epsilon)$, the following can then be written:

$$\varepsilon - \varphi = \pi - Arcos\left(\frac{K2}{\beta Q\sqrt{2K1 - \beta Q^2}}\right),$$

with $$Y = \frac{|I|}{|Q|},$$

and $$\beta Q = \sqrt{2\frac{K1}{1 = Y^2}}.$$

It should be noted that alternative, this gain compensation can be performed by multiplying one of the paths by the ratio between gains $\beta Q/\beta I$ or the inverse thereof. For example, path I is left as it is and path Q is multiplied by ratio $\beta Q/\beta I$.

At the output of the compensation network described hereabove, paths I and Q are sent to a compound mixer 20 associated with low-pass filters (not shown in FIG. 4).

The compound mixer is, for example, formed of four mixers 40, 41, 42, 43. A first mixer 40 receives path I and the frequency signal in phase provided by local oscillator 21. For simplification, local oscillator 21 and phase shifter 22 of FIG. 2 have been shown by a single element in Fig.4. A second mixer 41 receives path I and the frequency signal of local oscillator 21 out of phase by 90°. A third mixer 42 receives path Q and the frequency signal of local oscillator 21 out of phase by 90°. A fourth mixer 43 receives path Q and the frequency signal of local oscillator 21 in phase. The output of mixer 40 is sent onto an adder 44 receiving, on a second input, the output of mixer 42 with a negative sign. The output of adder 44 is sent onto low-pass filter 23 (FIG. 2). The output of mixer 43 is sent onto an adder 45 receiving, on a second input, the output of mixer 41. The output of adder 45 is sent onto low-pass filter 24 (FIG. 2).

The operation of a compound mixer such as described hereabove is perfectly conventional. One could, for example, refer to "A single-chip 900 MHz CMOS receiver front-end with a high performance low IF topology", published in IEEE on Dec. 12, 1995 (volume 30, N° 12, pages 1483 to 1492) which is incorporated herein by reference.

An advantage of the present invention is that it requires no iteration to determine the phase and gain errors enabling compensation, on the digital side, of the drifts of the analog portion.

Another advantage of the present invention, according to the embodiment illustrated in FIG. 4, is that it has no approximation in the calculation and thus results in a much more accurate value than in case of an iterative measurement.

However, since the analog-to-digital converters as well as the fast Fourier transforms can generate quantization errors, it will be preferred to perform several measurements in the useful channel for different frequencies, although theoretically, a single measurement for a single frequency is enough. The number of measurements performed in the useful channel depends on the desired accuracy for the correction transfer function on the digital side. Preferably, the number of measurement points within the useful bandwidth depends upon the range of the low pass filters 7' and 8'. When the rank of the filter is higher, the number of measurement points must be higher. For example, the choice of a number of measurement points equal to the rank of the filters 7' and 8' provides good results.

It should be noted that the present invention only implements amplitude measurements and comparisons of amplitude measurements between paths I and Q to extract the four values M1, M2, |I| and |Q| required for the calculation of the phase and amplitude compensation.

Of course, the present invention is likely to have various alterations, modifications, and improvements which will readily occur to those skilled in the art. In particular, the practical realization of a receiver respecting the architecture of the present invention is within the abilities of those skilled in the art based on the functional indications given hereabove. On this respect, it should be noted that although reference has been made in the foregoing description to a vocabulary which corresponds more to an analog technology than to a digital technology, the implementation of the present invention will be performed, for all that concerns the phase and gain variation compensation, by digital means. The different portions using analog circuits and digital circuits being perfectly identified in the foregoing description independently from the vocabulary used.

Further, although reference has been more specifically made in the foregoing description to an application to radiotelephony according to the GSM and DCS protocols, the present invention applies to any radiofrequency reception system in which the receiver has to isolate a useful channel from a plurality of channels in a reception frequency band, and in which the modulation uses the phase information. In particular, the invention also applies to channels having bandwidths larger than 200 KHz (for example, 1 MHZ or more). In this case, the low pass filters 7', 8', 23 and 24 have an adapted cut off frequency and the converters 11 and 12 are faster due to the larger bandwidth. It should be noted that the architecture according to the invention is independent from the bandwidth and that, contrary to conventional systems, the phase and gain errors are corrected on all the useful bandwidth.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A frequency conversion receiver at low intermediary frequency for receiving a signal contained in a channel having a predetermined bandwidth and a predetermined central frequency including:

a first analog mixer of a received signal with a signal coming from a local oscillator at a first conversion frequency, the output of the first mixer defaming a first path intended to be subject to an analog-to-digital conversion; and a second analog mixer of the incoming signal with the signal coming from the local oscillator out of phase by 90°, the output of the second mixer defining a second path intended to be subject to an analog-to-digital conversion, also including, on the digital side, means for detecting a possible phase difference and a possible gain difference between the signals of the two paths, and wherein the first conversion frequency corresponds to the central frequency of the received channel, plus half the channel bandwidth, said detecting means including:

a first means for extracting a first measured value corresponding to the amplitude of the first path out of phase by 90° and minus the amplitude of the second path;

a second means for extracting a second value corresponding to the amplitude of the first path out of phase by 90° and plus the amplitude of the second path; and means for measuring the respective amplitudes of the two paths.

2. The receiver of claim 1, wherein the detection of the phase and gain differences is made outside the reception period of the useful data.

3. The receiver of claim 1, including, on the digital side, means for applying, to at least one of the paths, a compensation based on the previously calculated values.

4. A method of reception of radiofrequency signals of the type including:

a first analog frequency conversion performed on the received signal and providing two analog paths respectively in phase and in phase quadrature; and a second frequency conversion performed after quantization of signals resulting from the first frequency conversion, and including, on the digital side, of performing a non-iterative compensation of possible phase and/or gain drifts between the two analog paths.

5. The method of claim 4, including of extracting from the two digital paths:

the amplitude of each path;

a first measurement value corresponding to the amplitude of a first path out of phase by 90° and minus the amplitude of the second path; and a second measurement value corresponding to the amplitude of the first path out of phase by 90° and plus the amplitude of the second path.

6. The method of claim 5, wherein the measurement values are obtained outside the reception periods of the useful data.

7. The reception method of claim 4, including choosing, as the intermediary frequency of the useful band of the received channel, the median frequency of the useful band of the received channel.

8. The reception method of claim 7, wherein the second frequency conversion is performed at a null intermediary frequency.

* * * * *

UNITED STATES PATENT AND TRADEMARK OFFICE
CERTIFICATE OF CORRECTION

PATENT NO. : 6,356,747 B1  Page 1 of 2
DATED : March 12, 2002
INVENTOR(S) : Regis Miquel and Patrice Garcia It is certified that error appears in the above-identified patent and that said Letters Patent is hereby corrected as shown below:

Column 8,
Line 19, should read: -- $\cos(\omega 2t) + j\sin(\omega 2t + \Delta\Phi\alpha^2)/\alpha$, --
Line 32, should read -- The only difference is that the phase errors, respectively $\varphi$ --
Line 46, should read: -- two values ($-\Delta\Phi=\varepsilon-\varphi$ and $\Delta G$). One of the two values indeed --

Column 9,
Line 22, should read: -- Phase variation $\Delta\Phi$ can be written as $\varepsilon-\varphi$ and, based on --
Lines 25-29, should read: --

$$\varepsilon - \varphi = \pi - Ar\ \cos\left[\frac{|M1|^2 - |M2|^2}{\beta Q\sqrt{2(|M1|^2 + |M2|^2) - \beta Q^2}}\right],$$

--

Line 56, should read: --
$-\Delta\Phi(\varphi-\varepsilon)$ --

Column 10,
Lines 9-10, should read: --

$$M2 = |I'+Q| = \frac{1}{2}\sqrt{\beta I^2 + \beta Q^2 + 2\beta I\beta Q \cos(\varphi-\varepsilon)},\text{ and}$$

$$M1 = |I'+Q| = \frac{1}{2}\sqrt{\beta I^2 + \beta Q^2 + 2\beta I\beta Q \cos(\varphi-\varepsilon)}.$$

--

Line 15, should read:
-- $K^2 = M1^2 = M2^2 = -\beta I\beta Q \cos(\varphi - \varepsilon)$. --

UNITED STATES PATENT AND TRADEMARK OFFICE
CERTIFICATE OF CORRECTION

PATENT NO.   : 6,356,747 B1
DATED        : March 12, 2002
INVENTOR(S)  : Regis Miquel and Patrice Garcia It is certified that error appears in the above-identified patent and that said Letters Patent is hereby corrected as shown below:

Column 10 cont'd,
Lines 18-20 should read: --

$$\varepsilon - \varphi = \pi - Ar\ \cos\left(\frac{K2}{\beta Q\sqrt{2K1 - \beta Q^2}}\right),$$

--

Signed and Sealed this

Twenty-seventh Day of August, 2002

*Attest:*

*Attesting Officer*

JAMES E. ROGAN
*Director of the United States Patent and Trademark Office*